Dec. 15, 1970 S. RIGO 3,547,786

MIXED PROTECTIVE COATING OF SEMICONDUCTIVE BODIES

Filed Aug. 12, 1968

United States Patent Office 3,547,786

Patented Dec. 15, 1970

3,547,786

MIXED PROTECTIVE COATING OF SEMICONDUCTIVE BODIES

Serge Rigo, Drancy, France, assignor to Compagnie Generale d'Electricite, Paris, France, a corporation of France Filed Aug. 12, 1968, Ser. No. 751,976
Claims priority, application France, Aug. 11, 1967, 117,835
Int. Cl. C23c *15/00*
U.S. Cl. 204—38 4 Claims

ABSTRACT OF THE DISCLOSURE

Electrochemical process for forming a semiconductor device by superimposing two layers of silicon dioxide upon silicon by first anodizing to form a first layer and then forming a second, thinner layer, by cathode sputtering.

This invention relates to a process for achieving a mixed protective coating, notably for semiconductors, and the products obtained, such as semiconductors covered by the said coating.

There will hereinafter be referred to as a "mixed coating" of material on a substrate, which coating is formed by the superposition of at least two coatings obtained by different methods of application.

The coatings of the present invention are used for mechanical protection or electrical insulation or any other object. They may be employed notably on surfaces of semiconductor bodies such as silicon and its derivaties.

In the semiconductor art, it is known to protect the highly chemically active surface of the semiconductor body in the course of the manufacture of the component, or the surface of the component when finished, by means of an insulating coating.

Such coatings are employed to protect the pn-junctions of semiconductor devices so as to lengthen their useful life, to improve their reliability and to reduce their noise. They also allow alternation of insulated regions and active regions by known methods of selective masking. In these various respects, they perform a principal function in the production of integrated circuits, of integrated circuit matrices and of related devices obtained by similar technical processes.

For the production of such an insulated coating, it is known to cause a layer of silica $SiO_2$ to grow from the surface of the silicon; this layer is obtained by a very conventional process of thermal oxidation of the surface of the silicon. The temperature at which the oxide $SiO_2$ grows is high, namely 1000° to 1200° C. The active impurities existing in the silicon substrate prior to the production of the layer of oxide rediffuse throughout the duration of the thermal oxidation treatment, since the temperature range of oxide growth is precisely the temperature range which favors the diffusion of the impurities into the silicon. This results in a displacement of the previously located pn-junction in the semiconductor body, which constitutes a disadvantage of this method of protection, since not only is the location of the junction modified in the course of the thermal oxidation at temperatures which favor the diffusion, but the profile of the junction itself is changed by reason of the disparity of the speeds of diffusion of each impurity at equal temperature. This disadvantage is prohibitive in many cases. Attempts have been made to produce insulating oxide layers on semiconductors such as silicon without having to apply a thermal treatment at high temperature in order to avoid the above-described disadvantages.

Recourse has been had to the anodic oxidation of silicon.

Despite the double advantage of production at ambient temperature and of excellent electrical characteristics, the anodic oxide layers have proved unstable in time.

The lack of stability is due to the fact that the anodic oxide layer is hygroscopic and undergoes a modification in the very first hours following its preparation. In addition, in this process, the thickness of the layer obtained is limited to about 300 angstroms. The anodic oxide has uncontested properties, in that it has good mechanical adherence to the substrate, is independent of the substrate, is not influenced by the latter and does not subject it to any degradation. The electrical properties of a fresh layer are superior to those of the layer produced by thermal oxidation. After aging, they still compare advantageously with those produced by thermal oxidation, which will hereinafter be called thermal oxides.

Oxide layers have also been produced by cathode sputtering at low temperature, below 300° C. Such layers may be obtained by synthesis independently of the substrate, for example by a process known as "reactive" atomization. Thus, silicon oxide can be obtained by atomizing elementary silicon in an oxidizing atmosphere in situ in the atomizing chamber. This synthetic oxide settles on the slicon substrate, on which it forms the desired layer. It is also possible to produce such layers by directly atomizing a silicon oxide such as molten silica, rock crystal or fused quartz. Such a process, which is carried out in a neutral atmosphere, is generally called "simple" atomization.

Regardless of the method employed, the layers obtained exhibit very advantageous mechanical and electrical properties which are scarcely inferior to those of the thermal oxide, and in addition they have the advantage of not being hygroscopic, but they have the disadvantage of degrading the silicon substrate. This is readily understandable, since in this method the oxide particles arrive on the substrate at a relatively high speed, and the resultant impact favors the adherence to the target, but also the degradation of the surface of the target. The thickness of the lavers obtained by this method is not limited.

In order to obviate the above-described disadvantages, $SiO_2$ oxide has been deposited by pyrolytic decomposition of an organo-oxysilane on the surface of a substrate maintained at about 725° C., this temperature generally having no harmful effect on the semiconductor component.

Hitherto, however, the oxide layers obtained by this process have not had the desired properties, because they are porous and therefore do not afford the desired protection.

The invention therefore realtes to a process for the preparation of a mixed oxide layer which is not attended by the acknowledged disadvantages of oxide layers as produced by the previously known processes.

In accordance with the present invention, a process for the preparation of a mixed protective coating is distinguished notably by the fact that a first layer is formed by anodic oxidation and that there is superimposed thereon a layer obtained by cathode sputtering. The invention is applicable with advantage to layers and coatings on a silicon substrate which may comprise one or more pn-junctions.

The invention is also directed to the products obtained, such as semiconductor components, covered by the aforesaid coating.

The process will be more readily understood from an example of the application thereof with the aid of the description and of the accompanying drawings, in which.

A semiconductor substrate, such as silicon, which optionally comprises one or more pn-junctions, is subjected to an anodic oxidizing operation.

This operation is applied to the previously polished surface of the silicon in an electrolytic diethylene-glycol medium, optionally with an addition of potassium nitrate, with an increasing-current program, due to which, the voltage is brought to the desired value, up to 200 volts maximum, by a procedure previously described in the article by Kover and Nannoni, published in "Revue Generale de l'Electricite," No. 75, year 1966, pages 777 to 784.

This operation results in the formation of a layer of oxide of a thickness of 1200 A. under given conditions.

The silicon substrate coated with the first layer obtained by the described process receives a further layer obtained by radio-frequency atomization of fused silica ($SiO_2$). The silica is atomized in an argon atmosphere at a pressure of one micron of Hg at a voltage of 2 kilovolts (acceleration voltage of the ions of the plasma by which the silica target is bombarded), with the aid of the apparatus marketed under the reference Mathis SP 210 A. The result of the operation is, for example, the production of an oxide layer of 300 A.

Figure 1:
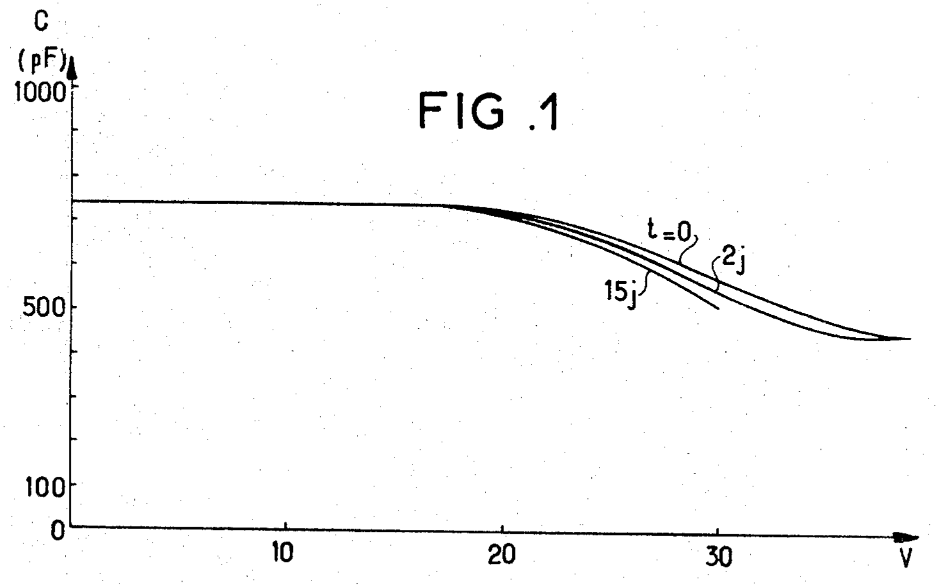
FIG. 1 is a plot of the capacitance of a metal-oxide semiconductor structure (MOS) comprising a coating according to the invention as a function of the bias voltage.

The mixed assembly composed of the first layer of 1200 A., of anodic origin, and of the second layer situated thereon, of atomized origin, of 300 A., making a layer of 1500 A., having the following properties:

(1) The mixed coating is not hygroscopic, as is shown by the curve of FIG. 1, which gives the capacitance (in picofarads) as a function of the bias voltage (in volts) of a MOS (metal-oxide-semiconductor) structure at intervals of nil, two days and fifteen days. From 0 to 20 volts, no variation can be detected.

Figure 2:
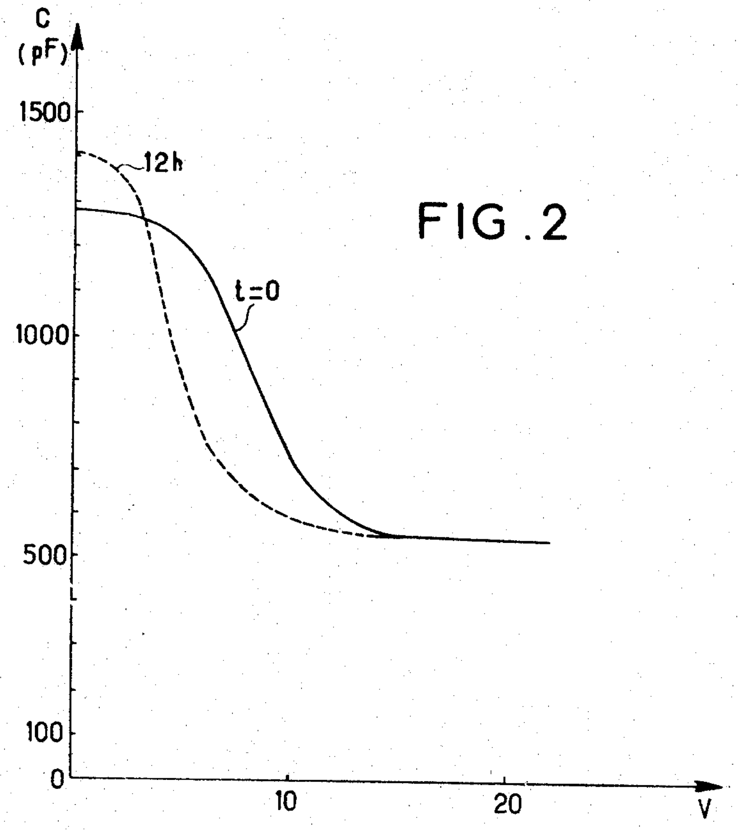
FIG. 2 is a plot of capacitance of a MOS structure comprising an anodic oxide coating produced by a known process against bias voltage.

Comparison with FIG. 2, which gives the capacitance of a MOS structure comprising an anodic oxide layer not stabilized by the process, plotted on the same co-ordinate system as in FIG. 1, shows, in the bias voltage interval from 0 to 20 volts, a considerable variation of the capacitance for an interval of only twelve hours.

(2) The mixed coating has very good adherence to the substrate.

(3) The mixed coating is continuous.

(4) The mixed coating has electrical properties scarcely inferior to those of the thermal oxide. These qualities are stable in time.

(5) The substrate does not undergo any apparent degradation due to the application of the mixed coating.

(6) The thickness of the mixed coating obtained is not limited by a saturation phenomenon, and it may be very accurately controlled as desired, by controlling each of the stages of the process, while the anodic oxidation process substantially limits the coating thickness to 3000 A.

The described process of production has been referred to as an example of the application of the process according to the invention, and has no limiting character.

The invention concerns the process for producing a mixed coating whose mechanical and electrical characteristics are reliable in time and may constitute a protective coating for a semiconductor component, and it also concerns the novel product consisting of a body provided with such a mixed coating, and more particularly semiconductor components protected by a mixed coating produced in accordance with the invention, as also the utilization of the dielectric or other properties of the mixed coating.

I claim:

1. A process for providing a multiple layer protective coating on a silicon substrate comprising the steps of:

forming a first coating layer of silicon dioxide on said substrate by anodic oxidation of said substrate in an electrolytic liquid medium, and superimposing another coating layer of silicon dioxide thereon, by radio frequency cathode sputtering of fused silica.

2. The process recited in claim 1 in which said electrolytic liquid medium is a diethylene glycol medium.

3. A coated silicon substrate comprising a first coating of silicon dioxide on said substrate produced by anodic oxidation of said substrate and a second superimposed coating of silicon dioxide produced by cathode sputtering of silica.

4. The coated silicon substrate recited in claim 3 wherein said first coating is thicker than said superimposed coating.

References Cited

UNITED STATES PATENTS

| | | | |
|---|---|---|---|
| 3,376,481 | 4/1968 | Klerer | 204—38 |
| 3,257,592 | 6/1966 | Maissel | 317—258 |
| 3,241,931 | 3/1966 | Triggs et al. | 29—195 |

OTHER REFERENCES

IBM Technical Disclosure Bulletin, vol. 10, No. 2 July 1967, P. J. Burkhardt, p. 160.

J. Electrochem. Coc., vol. 113, No. 11, Nov. 1966, p. 1210, R. Dreiner.

JOHN H. MACK, Primary Examiner

R. L. ANDREWS, Assistant Examiner

U.S. Cl. X.R.

204—56, 192